United States Patent [19]
Hakozaki et al.

[11] Patent Number: 5,599,727
[45] Date of Patent: Feb. 4, 1997

[54] METHOD FOR PRODUCING A FLOATING GATE MEMORY DEVICE INCLUDING IMPLANTING IONS THROUGH AN OXIDIZED PORTION OF THE SILICON FILM FROM WHICH THE FLOATING GATE IS FORMED

[75] Inventors: Kenji Hakozaki, Tenri; Shin-ichi Sato, Nara, both of Japan

[73] Assignee: Sharp Kabushiki Kaisha, Osaka, Japan

[21] Appl. No.: 456,867

[22] Filed: Jun. 1, 1995

[30] Foreign Application Priority Data

Dec. 15, 1994 [JP] Japan .................................. 6-311576

[51] Int. Cl.$^6$ ............................................. H01L 21/8247
[52] U.S. Cl. ............................ 437/43; 437/984; 437/983
[58] Field of Search .............................. 437/43, 984, 49, 437/968, 979, 983; 257/316

[56] References Cited

U.S. PATENT DOCUMENTS

| | | | |
|---|---|---|---|
| 5,029,130 | 7/1991 | Yeh | 365/185 |
| 5,045,488 | 9/1991 | Yeh | 437/43 |
| 5,067,108 | 11/1991 | Jenq | 365/185 |

FOREIGN PATENT DOCUMENTS

| | | | |
|---|---|---|---|
| 54-137983 | 10/1979 | Japan | 257/316 |
| 64-13771 | 1/1989 | Japan . | |
| 1-129465 | 5/1989 | Japan . | |
| 2-31467 | 2/1990 | Japan . | |

OTHER PUBLICATIONS

Salsbury et al, "High Performance MOS EPROMs Using a Stacked–Gate Cell", 1977 IEEE International Solid–State Circuits Conference, pp. 186–187, 1977.
Perlegos et al, "A 64K EPROM Using Scaled MOS Technology", 1980 IEEE International Solid–State Circuits Conference, pp. 142–143, p. 269, 1980.
Van Buskirk et al, "A 200ns 256K HMOSII EPROM", 1983 IEEE International Solid–State Circuits Conference, pp. 162–163, p. 301, 1983.
Gupta et al, "A 5V–Only 16K EEPROM Utilizing Oxynitride Dielectrics and EPROM Redundancy", 1982 IEEE International Solid–State Circuits Conference, pp. 184–185, p. 317, 1982.
Kynett et al, "An In–System Reprogrammable 256K CMOS Flash Memory", 1988 IEEE International Solid–State Circuits Conference, pp. 132–133, p. 330, 1988.
Tam et al, "A High Density CMOS 1–T Electrically Erasable Non–Volatile (Flash) Memory Technology", 1988 Symposium on VLSI Technology—Digest of Technical Papers, pp. 31–32.
Woo et al, "A Poly–Buffered Face Technology For High Density Flash Memories", 1991 Symposium on VLSI Technology—Digest of Technical Papers, pp. 73–74.
Sato et al, "An Ultra–Thin Fully Depleted Floating Gate Technology For 64Mb Flash and Beyond", 1994 Symposium on VLSI Technology—Digest of Technical Papers, p. 65.
Wolf et al., Silicon Processing for the VLSI ORA, vol I Process technology, p. 175, Laftso Press 1986.

*Primary Examiner*—H. Jey Tsai
*Attorney, Agent, or Firm*—Nixon & Vanderhye P.C.

[57] ABSTRACT

According to the present invention, a method for producing a nonvolatile semiconductor memory device is provided. The method includes the steps of: forming stripe-shaped silicon portions including a plurality of first portions to be used as a plurality of floating gates and a plurality of second portions interposed between two adjacent portions of the plurality of first portions by patterning a silicon film; forming a conductive film so as to cover an insulating film; forming a control gate so as to cover the plurality of first portions of the stripe-shaped silicon portions by patterning the conductive film; converting the plurality of second portions of the stripe-shaped silicon portions into a silicon oxide film, and forming the plurality of floating gates from the plurality of first portions by thermally oxidizing the plurality of second portions; and implanting impurity ions through the silicon oxide film into the active region on the semiconductor substrate by using the control gate as a mask, thereby forming a source region and a drain region in the active region.

9 Claims, 7 Drawing Sheets

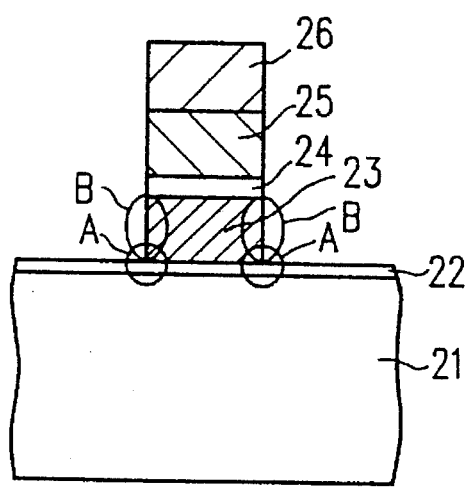 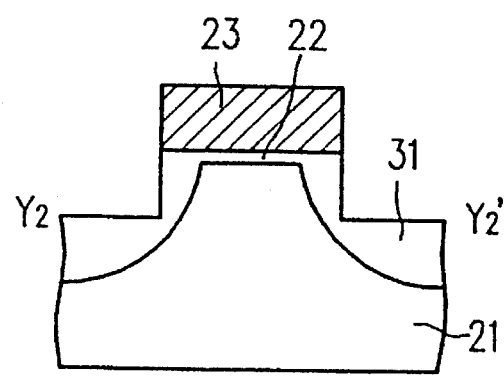
FIG. 6A (PRIOR ART)   FIG. 6B (PRIOR ART)

METHOD FOR PRODUCING A FLOATING GATE MEMORY DEVICE INCLUDING IMPLANTING IONS THROUGH AN OXIDIZED PORTION OF THE SILICON FILM FROM WHICH THE FLOATING GATE IS FORMED

BACKGROUND OF THE INVENTION

1. Field of the Invention

The present invention relates to a method for producing a nonvolatile semiconductor memory device. More specifically, the present invention relates to a method for producing a nonvolatile semiconductor memory device having a metal-oxide-semiconductor (MOS) structure in which floating gates are provided so as to be isolated from each other by every bit.

2. Description of the Related Art

Referring to FIG. 3, FIGS. 4A to 4F and FIGS. 5A to 5F, a conventional process for fabricating a nonvolatile semiconductor memory device having an MOS structure will be described. This nonvolatile memory device includes first gates (or floating gates) and second gates (or control gates). The floating gates are provided so as to be isolated from each other by every bit.

FIGS. 4A to 4F and FIGS. 5A to 5F show cross sections of the nonvolatile semiconductor memory device corresponding to principal stages of the production process thereof. FIGS. 4A to 4F are cross-sectional views taken along the line X—X' shown in FIG. 3, while FIGS. 5A to 5F are cross-sectional views taken along the line Y—Y' shown in FIG. 3.

First, a field oxide film 31 having a thickness of about 300 nm is formed in an isolation region on a silicon substrate 21 doped with a P-type impurity in a low concentration by using a conventional technique. Thereafter, a tunneling oxide film 22 having a thickness approximately ranging from 8 to 13 nm is formed on an active region by a thermal oxidization method, as shown in FIG. 4A and FIG. 5A.

Next, a polysilicon film 23a having a thickness of about 100 to 300 nm is formed by a chemical vapor deposition (CVD) method so as to cover the tunneling oxide film 22, as shown in FIG. 4B and FIG. 5B. After the polysilicon film 23a is doped with an impurity (phosphorus) by an ion implantation method, the implanted impurity is activated by an annealing step. The implant dose is adjusted so that the concentration of phosphorus in the polysilicon film 23a is in the approximate range of $10^{19}$ to $10^{20}$ cm$^{-3}$.

Then, stripe-shaped silicon portions 23b are formed from the polysilicon film 23a by conventional photolithography and etching techniques, as shown in FIG. 4C and FIG. 5C. These stripe-shaped silicon portions 23b are formed so as to cover the active region 32 in parallel to the region 32. Each stripe-shaped silicon portion 23b includes first portions to be used as a plurality of floating gates and second portions interposed between the adjacent first portions. The second portions of each stripe-shaped silicon portion 23b is etched by a later process step.

After an ONO film 24 (the thickness of an oxide film equivalent to the ONO film 24 is in an approximate range of 13 to 25 nm) is formed on the surface of each stripe-shaped silicon portion 23b by a thermal oxidization method, a CVD method or the like, a polycide film, i.e., a tungsten silicide film (WSi film) 26 and a polysilicon film (poly-Si film) 25 are formed so as to constitute a control gate 27, as shown in FIG. 4D and FIG. 5D.

Subsequently, a control gate 27 in a predetermined shape is formed from the polycide films 25 and 26 by conventional photolithography and etching techniques, as shown in FIG. 4E. Each control gate 27 extends over the substrate 21 so as to cross the plurality of stripe-shaped silicon portions 23b at a right angle. When the patterning of the control gate 27 is finished, the exposed portions of the ONO film 24 in the region which is not covered with the control gate 27 are removed and therefore the upper surfaces of the stripe-shaped silicon portions 23b are partially exposed. After the etching process is over, the exposed portions of the stripe-shaped silicon portions 23b are etched. By performing this etching process, a plurality of floating gates 23 are formed from each stripe-shaped silicon portion 23b so as to be isolated by every bit. This etching process is conducted by a highly anisotropic reactive ion etching (RIE) technology using plasma.

Then, impurity ions such as arsenic ions are implanted into the surface of the silicon substrate 21 by an ion implantation method, thereby forming source regions 29 and drain regions 30 in the respective active regions of the silicon substrate 21, as shown in FIG. 4F. This ion implantation is conducted by using the control gates 27 as masks, so that the impurity ions are not implanted into the active regions located under the control gates 27. As a result, N' type high-concentration impurity regions are formed in self-alignment with the control gates 27, so as to serve as the source regions 29 and the drain regions 30.

Thereafter, by using conventional photolithography and etching techniques, contact holes are provided through the oxide film with a thickness of about 400 nm formed by a CVD method or the like, thereby forming metal lines.

Data is written into the nonvolatile memory device by injecting electrons through the tunneling oxide film into the floating gates 23 by a hot electron injection method or a Fowler-Nordheim (FN) method and then by increasing the threshold voltage thereof. The written data is erased by pulling out the electrons injected into the floating gates 23 to the source regions 29 by an FN tunneling method, an ultraviolet ray irradiation method or the like and then by lowering the threshold voltage.

According to the conventional production method described above, the polycide film 27, the ONO films 24 end the stripe-shaped silicon portions 23b are continuously etched by the RIE method or the like after the control gate 27 is formed- Generally, the etching rates can not always be reproduced satisfactorily. In such a case, the etching rate may be varied among the respective etching processes. In addition, since multiple nonvolatile memory elements are simultaneously formed on a single substrate (or a silicon wafer) generally of a size. of several inches, the etching rates may be varied depending on the positions on the substrate. In consideration of the possible variation in the etching rates, the etching conditions to be actually employed are determined so that a larger amount of a film than the Mount calculated based on the thickness of the film to be etched and the etching rate is etched. For example, an "over-etching" is performed under a condition for etching an approximately ten-percent-thicker film than the film to be etched. In the case of conducting such an over-etching, the side walls (i.e., the portions B as shown in FIG. 6A) of each floating gate 23 and the portions of the tunneling oxide film 22 under both ends of the floating gate 23 (i.e., the portions a as shown in FIG. 6A) are much damaged by the irradiation during the time the RIE is performed, so that many defects are generated.

The defects generated in the portions of the tunneling oxide film 22 Just under both ends of the floating gate 23 become a major cause of lowering of the characteristics of a flash memory. For example, in a cell where defects are generated in an overlapped region between the source (not shown in FIG. 6A) of the tunneling oxide film 22 and the floating gate 23, an erasure rate may be excessively accelerated, so that an over-erased cell is possibly generated. If such an over-erased cell exists, then a data read can not be performed appropriately. Moreover, such defects may generate a hole trap level. In such a case, the holes generated by a tunneling phenomenon between the bands are captured by this hole trap level when the data is erased, so that the rewritability of the flash memory is degraded. Furthermore, when the defects are generated on the side walls of the floating gate 23, an oxide film damaged by a subsequent thermal oxidization process will exist. Accordingly, the electrons accumulated in the floating gate 23 can not be pulled out easily, and therefore the data storage property is disadvantageously degraded.

In addition, with respect to the etching process for forming the control gates 27, when the ONO film 24 is etched, the ONO film 24 on the side walls of the stripe-shaped silicon portion 23b is also required to be etched The ONO film 24 with a thickness substantially equal to that of the stripe-shaped silicon portion 23b is present on the side walls of the stripe-shaped silicon portion 23b in a direction vertical to the principal surface of the substrate 21. In order to remove the ONO film 24 completely, an over-etching is required to be performed at least by the amount corresponding to the thickness of the stripe-shaped silicon portion 23b. If such an over-etching is performed, then the exposed portions of the field oxide film 31 are also undesirably etched by an amount substantially corresponding to the thickness of the floating gate 23, as shown in FIG. 6B. This is because the etchant used for etching the ONO film 24 adversely etches the field oxide film 31. The thickness of the field oxide film 31 gradually decreases as the active region becomes closer to the film. Therefore, if the side walls of the stripe-shaped silicon portion are located over the regions of the field oxide film 31 where the thickness of he film is relatively small, then the etching of the ONO film 24 causes the exposure of the silicon substrate 21 under the field oxide film 31. Accordingly, the side walls of the stripe-shaped silicon portion 23b, i.e., the side walls of the floating gate 23, are required to be disposed where the thickness of the field oxide film 31 is larger than the amount to be removed of the field oxide film 31 when the ONO film 24 is etched. It is noted that FIGS. 6A and illustrating the problems of the conventional technologies, are cross-sectional views taken along the line $Y_2$—$Y_2'$ shown in FIG. 3.

SUMMARY OF THE INVENTION

According to the present invention, a method for producing a nonvolatile semiconductor memory device is provided. The method includes the steps of: forming a field insulating film on an isolation region on a semiconductor substrate end forming a tunneling oxide film on an active region; depositing a silicon film on the semiconductor substrate; forming stripe-shaped silicon portions including a plurality of first portions to be used as a plurality of floating gates and a plurality of second portions interposed between two adjacent portions of the plurality of first portions by patterning the silicon film; forming an insulating film so as to cover at least the stripe-shaped silicon portions; forming a conductive film so as to cover he insulating film; forming a control gate so as to cover the plurality of first portions of the stripe-shaped silicon portions by patterning the conductive film; converting the plurality of second portions of the stripe-shaped silicon portions into a silicon oxide film, and forming the plurality of floating gates from the plurality of first portions by thermally oxidizing the plurality of second portions; and implanting impurity ions through the silicon oxide film into the active region on he semiconductor substrate by using the control gate as a mask, thereby forming a source region and a drain region in the active region.

In one embodiment, the silicon film is in an amorphous state immediately after the silicon film is deposited, and then crystallized by performing a subsequent annealing process.

In another embodiment, a thickness of The silicon film is set to be in a range of 10 to 20 nm immediately after the silicon film is deposited.

In still another embodiment, the conductive film has a polycide structure.

Inn still another embodiment, the stripe-shaped silicon portions are formed so as to completely cover the active region.

In still another embodiment, the insulating film is an ONO film constituted by a first oxide film, a nitride film and a second oxide film.

In still another embodiment, the step of forming the control gate includes a step of continuously etching the conductive film and the insulating film, thereby removing at least a portion of the insulating film located over upper surfaces of the plurality of second portions of the stripe-shaped silicon portions.

According to the present invention, when the floating gates are formed so as to be isolated from each other by every nonvolatile memory element (or by every bit), the side walls of the floating gates and the tunneling oxide films Just under the side walls of the floating gates are not etched at all, so that these walls and films are not damaged by the irradiation of the charged particles generated from the plasma used for the etching process. Therefore, the defect caused by the irradiation damage may be eliminated. Consequently, the distribution width of the threshold values after the erasure may be suppressed and the rewrite resistance and the data storage property may be improved.

In addition, when the insulating film is etched in order to form a control gate, it is not necessary to remove the insulating films on the side walls of the stripe-shaped silicon portions to be served as the floating gates. Accordingly, it is possible to considerably suppress the reduction of the field oxide film when the insulating film is etched. Therefore, the floating gates are not required to be sufficiently overlapped on the ends of the field oxide film, so that the size of the cell may be reduced by the amount of the overlap margin which has conventionally been required.

Furthermore, by converting a deposited amorphous silicon film into a polysilicon film by a heat treatment, it is possible to form a polysilicon thin film whose surface is flatter as compared with the case where a polysilicon film is directly deposited. Consequently, a thin floating gate may be formed with higher reliability.

Thus, the invention described herein makes possible the advantage of providing a method for producing a nonvolatile semiconductor memory device allowing for elimination of the problems caused by the etching process when a control gate is formed.

This and other advantages of the present invention will become apparent to those skilled in the art upon reading and understanding the following detailed description with reference =o the accompanying figures.

BRIEF DESCRIPTION OF THE DRAWINGS

FIGS. 6A and 6B are cross-sectional views taken along the line $Y_2Y_2'$ of FIG. 3 illustrating the problems of a conventional method for producing a nonvolatile semiconductor memory device.

DESCRIPTION OF THE PREFERRED EMBODIMENTS

Figure 3:
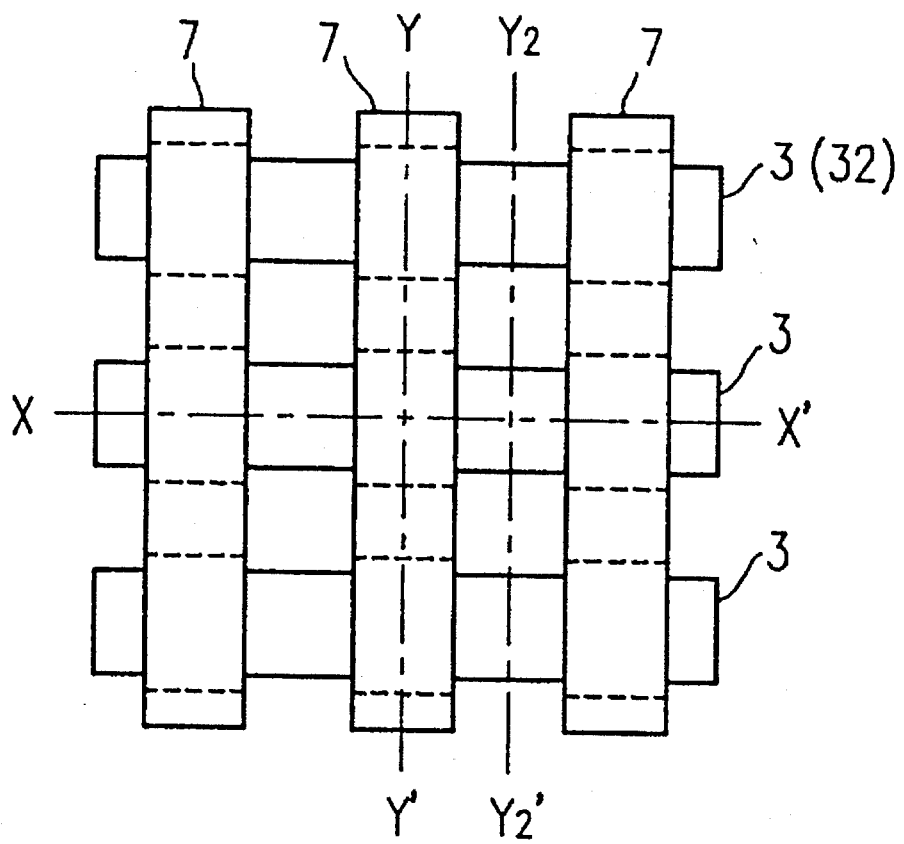
FIG. 3 is a plan view showing a layout of a nonvolatile semiconductor memory device.
Figure 4A:
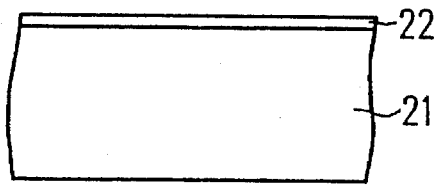
FIGS. 4A to 4F are cross-sectional views taken along the line X-X' of FIG. 3 showing respective steps for producing a conventional nonvolatile semiconductor memory device.
Figure 4B:
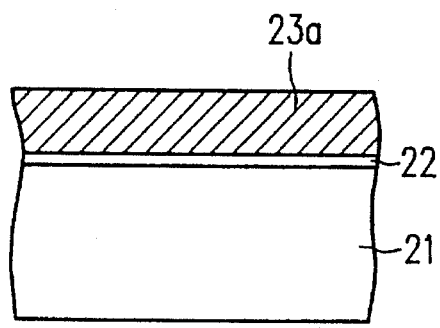
Figure 4C:
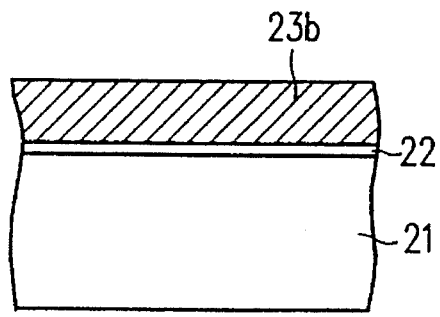
Figure 4D:
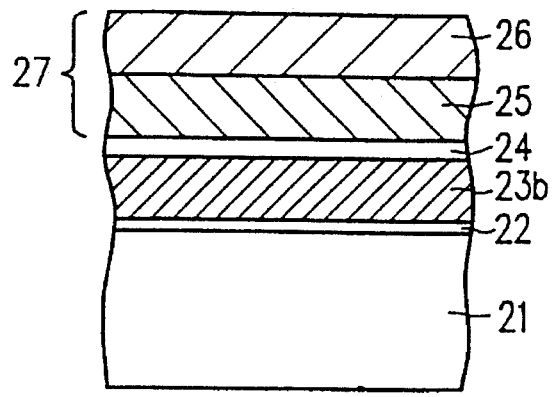
Figure 4E:
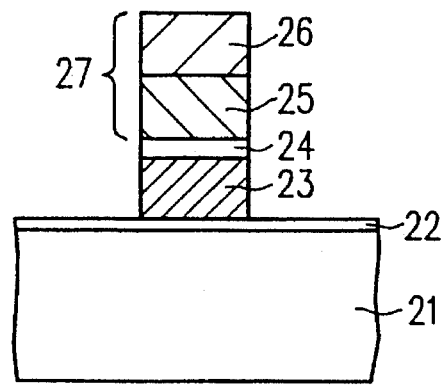
Figure 4F:
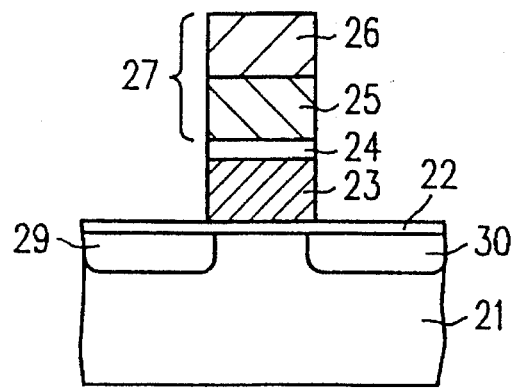
Figure 5A:
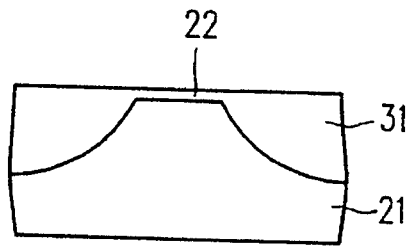
FIGS. 5A to 5F are cross-sectional views taken along the line Y-Y' of FIG. 3 showing respective steps for producing a conventional nonvolatile semiconductor memory device.
Figure 5B:
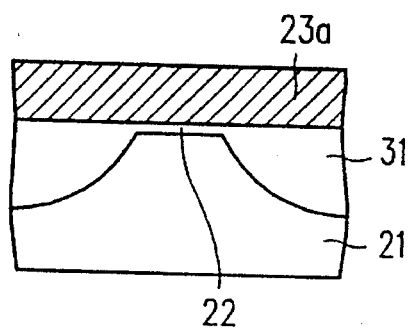
Figure 5C:
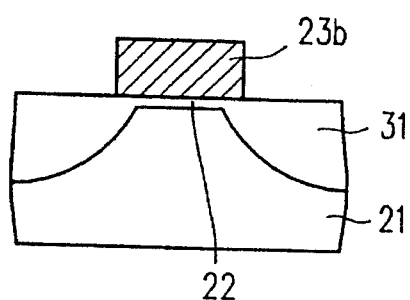
Figure 5D:
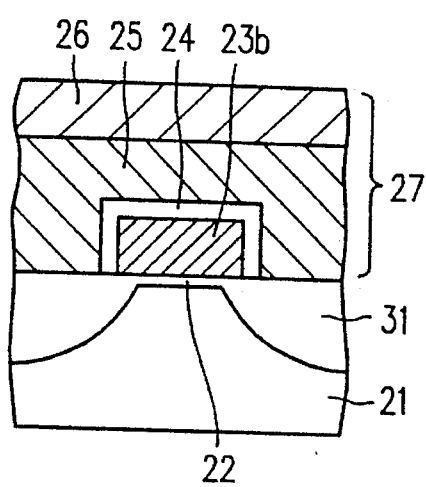
Figure 5E:
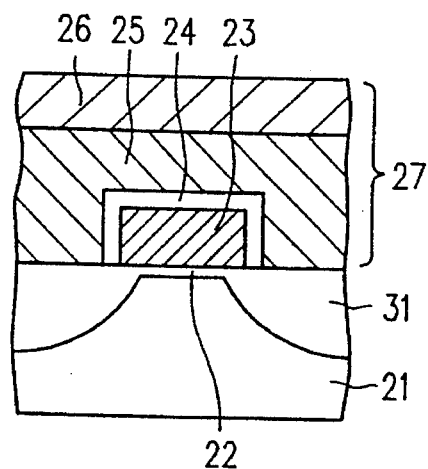
Figure 5F:
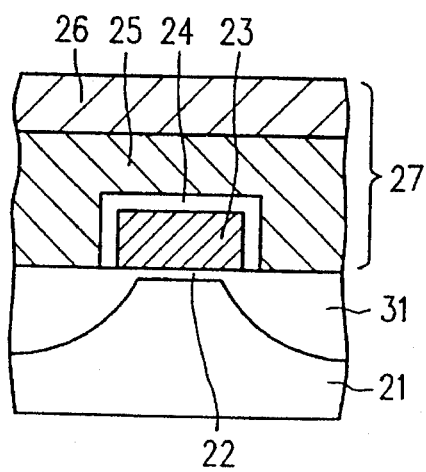

Hereinafter, an exemplary method for producing a nonvolatile semiconductor memory device according to the present invention will be described with reference to the accompanying drawings. The plane layout of the nonvolatile semiconductor memory device to be produced in accordance with this exemplary method is fundamentally the same as a conventional one as shown in FIG. 3.

Figure 7:
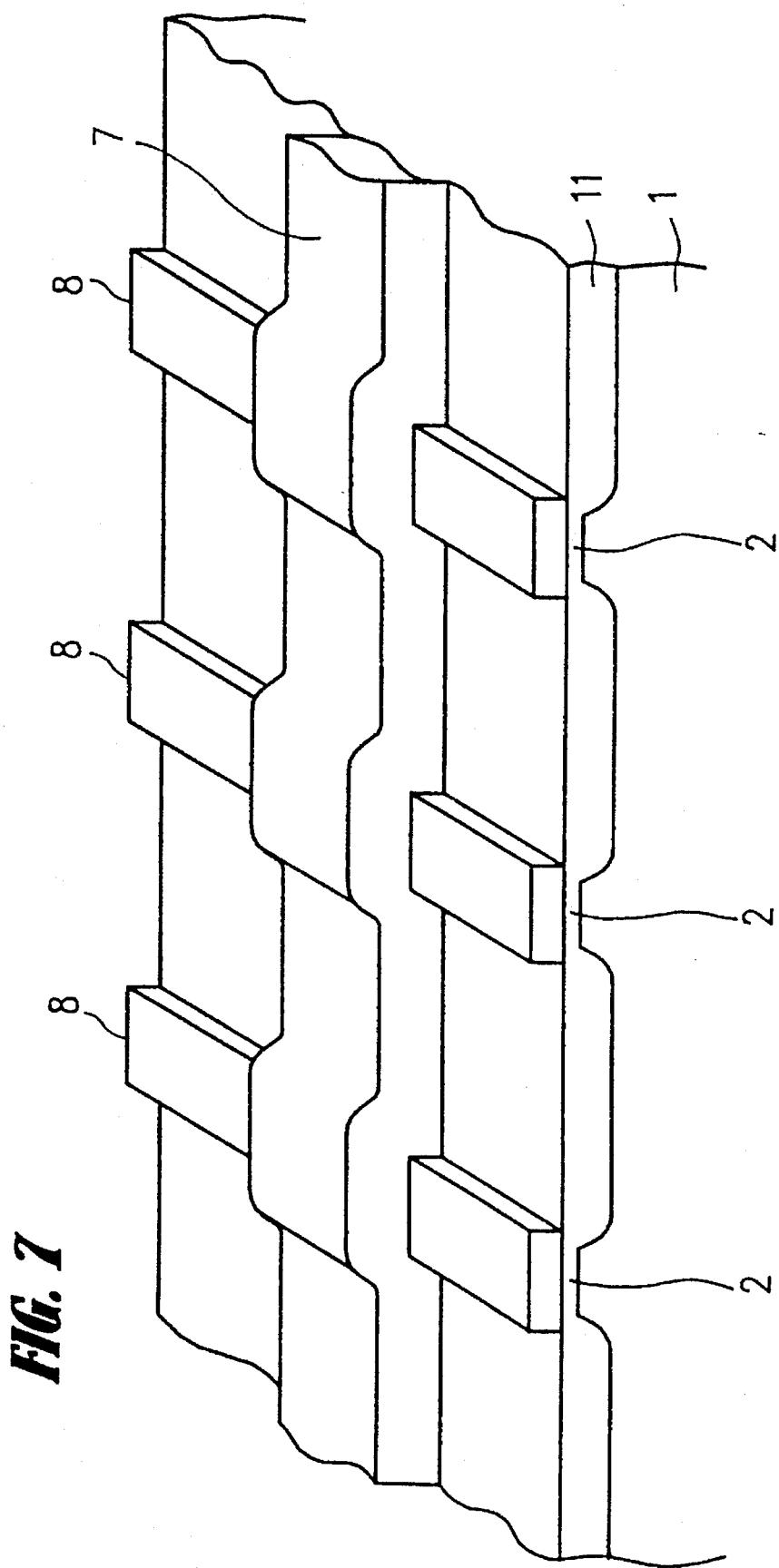
FIG. 7 is a perspective view showing three nonvolatile semiconductor memory elements at a middle stage of the production process thereof.

Next, with reference to FIGS. 1A to 1G, FIGS. 2A to 2G, and FIG. 7, a fabricating method of this example will be described in detail below. FIGS. 1A to 1G and FIGS. 2A to 2G show the cross sections of the nonvolatile semiconductor memory device corresponding to the principal stages of the production process of this example. FIGS. 1A to 1G are cross-sectional views taken along the line X—X' of FIG. 3, while FIGS. 2A to 2G are cross-sectional views taken along the line Y—Y' of FIG. 3. FIG. 7 is a perspective view showing three nonvolatile semiconductor memory elements at a middle stage of the fabrication process thereof.

In actuality, as shown in FIG. 7, a plurality of nonvolatile semiconductor memory elements are simultaneously formed on a silicon substrate 1. In the following description, a method for producing one nonvolatile semiconductor memory element will be described for simplification.

Figure 1A:
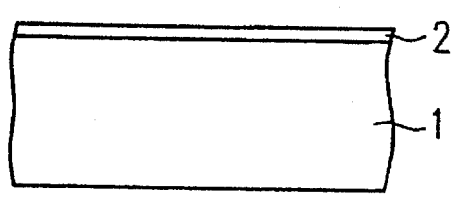
FIGS. 1A to 1G are cross-sectional views taken along the line X-X' of FIG. 3 showing respective steps for producing a nonvolatile semiconductor memory device according to an example of the present invention.
Figure 2A:
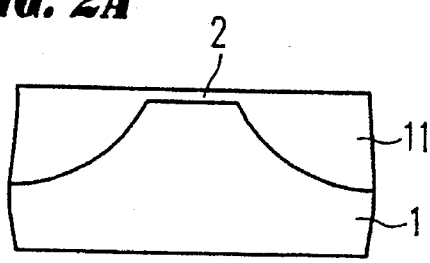
FIGS. 2A to 2G are cross-sectional views taken along the line Y-Y' of FIG. 3 showing respective steps for producing a nonvolatile semiconductor memory device according to an example of the present invention.

First, a field oxide film 11 having a film thickness of about 300 nm is formed by a conventional technique on an isolation region of the silicon substrate 1 doped with a P-type impurity in a low concentration. Then, a tunneling oxide film 2 having a thickness approximately ranging from 8 to 13 nm is formed on an active region by a thermal oxidization method, as shown in FIG. 1A and FIG. 2A.

Figure 1B:
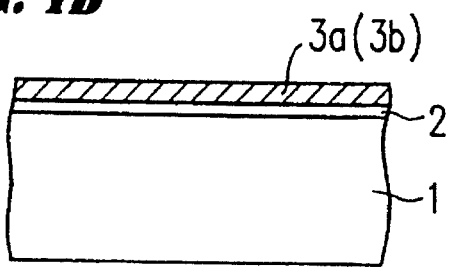
Figure 2B:
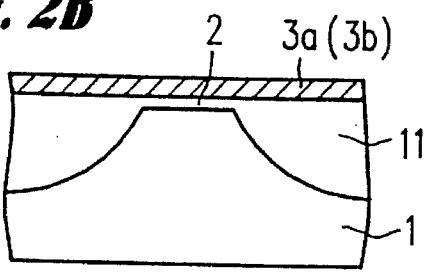

Next, an amorphous silicon film 3a with a thickness preferably in the range of about 10 to 20 nm is deposited so as to cover the tunneling oxide film 2 by a low-pressure chemical vapor deposition (LPCVD) method, as shown in FIG. 1B and FIG. 2B. According to the invention, as will be described in detail later, after forming stripe-shaped silicon portions covering the active region by patterning the amorphous silicon film 3a, a plurality of floating gates are formed from each stripe-shaped silicon portion. In this case, parts of the stripe-shaped silicon portions (parts which are not to be used as the floating gates) are completely thermally oxidized, thereby converting the parts into a silicon oxide film. If a conventional silicon film with a large thickness, e.g., 200 nm, is used in place of the thin amorphous silicon film 3a, then the thickness of the oxide film to be formed by the thermal oxidization becomes approximately 400 nm. The thermal oxidization proceeds not only An the vertical direction but also in the horizontal direction to the same degree. Accordingly, as the thickness of the silicon oxide film to be formed from the amorphous silicon film 3a becomes larger, he width of the floating gate to be formed becomes smaller. In addition, owing to the bird's beak caused by the thermal oxidization, the ONO film between %he end portion of the floating gate and the control gate becomes thick, and therefore the coupling capacitance becomes small. Furthermore, the deformation of the control gate is generated, so that the upper silicide film is possibly ripped off in the case where the control gate has a polycide gate structure.

After depositing a thick silicon film in place of depositing a thin silicon film and before oxidizing the thick silicon film, it is possible %o remove almost the upper half portion of the %hick silicon film by the etching technique. However, such a method increases the number of the fabrication process steps, and in addition, it is difficult to control the amount of the silicon film to be etched.

Thus, it is preferable to deposit a silicon film with a thickness thin enough to prevent the abovementioned problems caused by the oxidization. Strictly speaking, the range of the preferable thickness of the amorphous silicon film 3a depends on the width of the control gate to be formed. Since the width of the control gate is set to be 0.65 μm in this example, the thickness of the amorphous silicon film 3a is suitably in the range of 10 to 20 nm. However, it is preferable to vary the thickness of the floating gate in accordance with the width of the control gate.

Next, an oxide film (not shown) having a thickness of about 15 nm is formed on the amorphous silicon film 3a by a CVD method or the like, and then arsenic ions are implanted through the oxide film into the amorphous silicon film 3a. The implant dose is adjusted so that the concentration of the impurity in the amorphous silicon film 3a is approximately in the range of $10^{19}$ to $10^{20}$ cm$^{-3}$. The ions to be implanted may be phosphorus ions or boron ions. Also, an impurity doping method other than the ion implantation method may also be employed.

Subsequently, after removing the oxide film by using an HF aqueous solution or the like, the solid-phase growth-of the amorphous silicon film 3a is performed by a heat treatment, so as to obtain a first polysilicon film 3b. In this example, arsenic ions are implanted by setting the implant dose to be $3\times10^{14}$/cm$^2$ at the acceleration energy of 20 KeV, and then the heat treatment is performed at 600° C. for 24 hours under a nitrogen gas ambient. Thereafter, the thermal oxidization is further performed at 900° C., thereby improving the crystallinity of the first polysilicon film.

In this example, after depositing the amorphous silicon film 3a, a first polysilicon film 3b is formed by the crystallization method. Alternatively, the first polysilicon film 3b may be deposited directly by a CVD method or the like. However, according to the method of this example where the first polysilicon film 3b is formed by he crystallization method once the thin amorphous silicon film 3a is deposited, a silicon film having a flat upper surface is advantageously obtained easily.

Figure 1C:
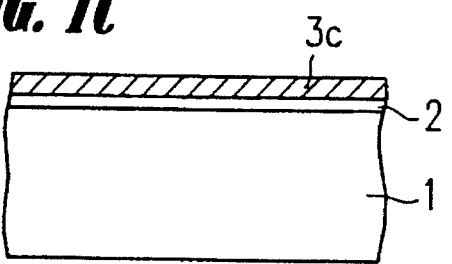
Figure 1D:
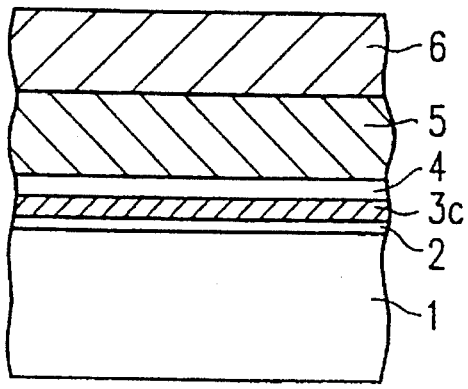
Figure 2C:
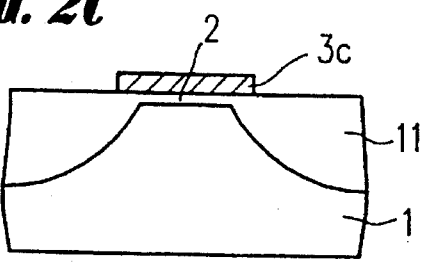
Figure 2D:
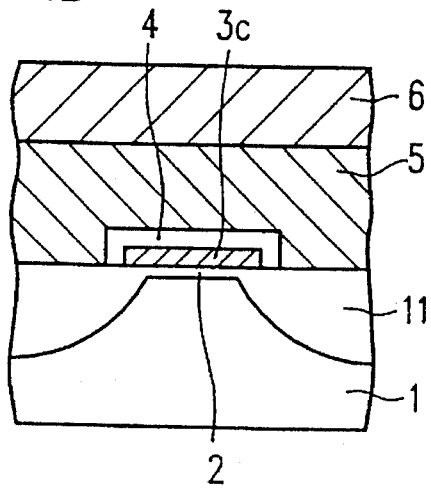

Next, stripe-shaped silicon portions 3c are formed from the first polysilicon film 3b by using conventional photolithography and etching techniques so as to cover the active region, as shown in FIG. 1C and FIG. 2C. Then, after an ONO film 4 (he thickness of the oxide film equivalent to the ONO film 4 is in an approximate range of 13 to 25 run) is formed on the surface of the stripe-shaped silicon portions 3c by a thermal oxidization method, a CVD method or the like, a polycide film, i.e., a tungsten silicide film 6 (thickness: about 100 nm) and a second polysilicon film 5 (thickness: about 100 nm) are formed so as to constitute a control gate 7, as shown in FIG. 1D and FIG. 2D.

Figure 1E:
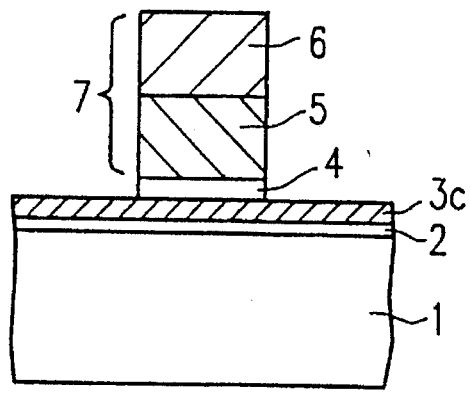
Figure 2E:
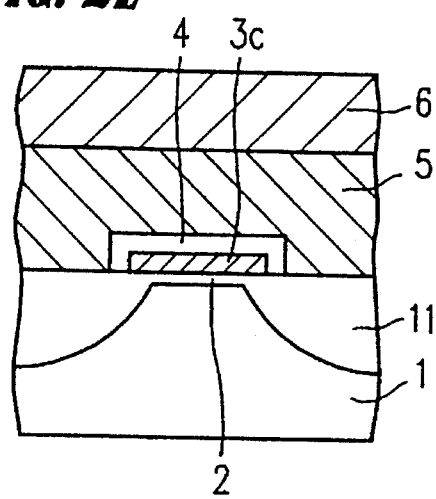

Subsequently, a control gate 7 in a predetermined shape is formed from the polycide films 5 and 6 by conventional photolithography and etching techniques, as shown in FIG. 1E and FIG. 2E. By performing this process, the ONO film 4 is etched in the same pattern as that of the control gate 7. The control gate 7 extends over the substrate 1 so as to cross the plurality of stripe-shaped silicon portions 3c at a right angle. The regions of the surface of the stripe-shaped silicon portions 3c not covered with the control gate 7 are exposed.

Figure 1F:
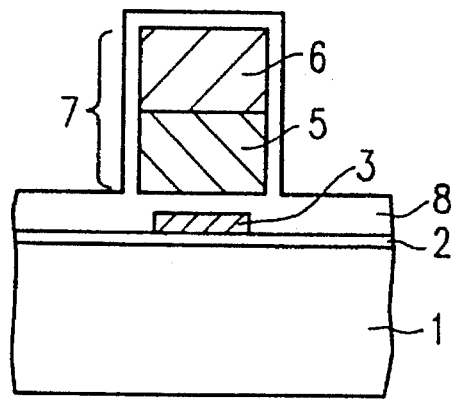
Figure 2F:
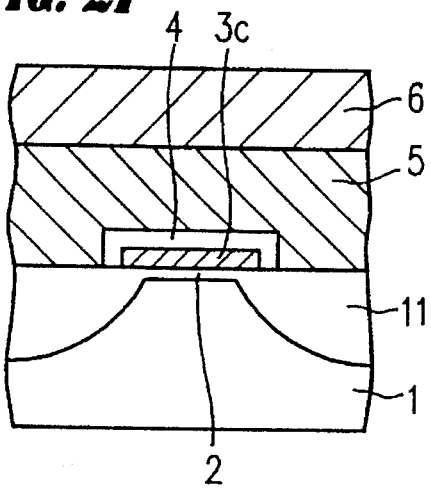
Figure 2G:
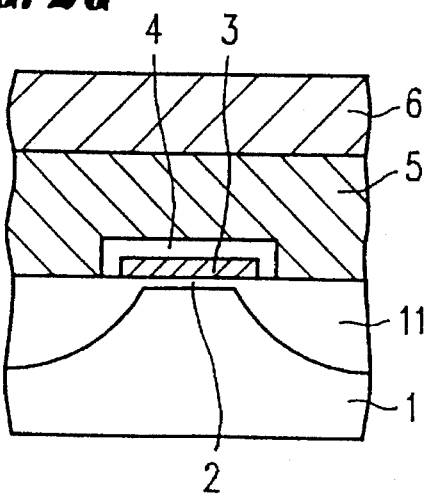

Next, a thermal oxidization process is performed. By conducting the thermal oxidization, the surface of the control gate 7 is also oxidized, and at the same time, the selected parts of the stripe-shaped silicon portions 3c are completely converted into the silicon oxide film 8, as shown in FIG. 1F, FIG. 2F and FIG. 7. According to this thermal oxidization process, however, the parts of the stripe-shaped silicon portions 3c which are located below the control gate 7 are not oxidized so as to be floating gates 3. This selective oxidization makes it possible to form a plurality of floating gates 3 from each stripe-shaped silicon portion 3c and to isolate adjacent floating gates 3 by the silicon oxide film 8. In this example, since adjacent floating gates 3 are isolated from each other by the silicon oxide film 8, the interface between the silicon oxide film 8 and the floating gate 3, i.e., the side wall of the floating gate 3, is not damaged by the etching process. In addition, the ONO film Just under the side wall of the floating gate 3 end the field oxide film 11 are not etched, either. Moreover, since the stripe-shaped silicon portions 3c completely cover the active regions, the surfaces of the active regions can not be oxidized by the thermal oxidization process.

In this example, in order to oxidize the stripe-shaped silicon portions 3c, an oxidization using an HCl gas is performed at 90° C. However, the oxidization condition is not limited thereto. It is sufficient if a silicon oxide film 8 having satisfactory insulation properties can be formed at a temperature where the profile of the concentration of the impurity inside the silicon substrate i is not varied largely. The silicon oxide film 8 is required to be formed so that the end portion of the floating gate overlaps with the source region. The reason for this disposition is as follows. The erasure is performed by lowering the threshold voltage for pulling the electrons out from the floating gate into the source. Accordingly, if the overlapped portion is not provided, the erasure rate becomes disadvantageously slow. However, if the channel erasure is performed, this limitation is not necessary.

Figure 1G:
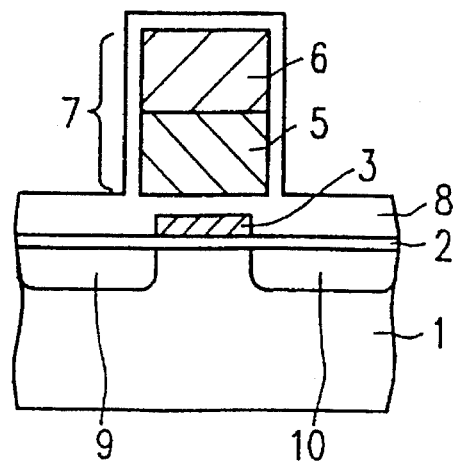

Then, impurity ions such as arsenic ions are implanted into the surface of the silicon substrate 1 by an ion implantation method, thereby forming a source region 9 and a drain region 10 in each active region of the silicon substrate 1, as shown in FIG. 1G. This ion implantation is conducted by using the control gate 7 as a mask, so that the impurity ions are not implanted into the active region located just under the control gate 7. On the other hand, the impurity ions reach the inside of the active region by penetrating through the silicon oxide film 8 having a relatively small thickness. As a result, an $N^+$ type high-concentration impurity region is formed with respect to the control gate 7 in a self-alignment manner, so as to serve as the source region 9 and the drain region 10.

Thereafter, by using conventional photolithography and etching techniques, contact holes are provided over the entire oxide film with a thickness of about 400 run formed by a CVD method or the like, thereby forming metal lines.

In the above-described example, after the field oxide film 11 is formed, the amorphous silicon film to be served as the floating gates is formed on the active regions. Alternatively, after the amorphous silicon film is formed, a thin oxide film and a silicon nitride film may be deposited, and after removing the silicon nitride film, the thin oxide film and the amorphous silicon film which are disposed in the regions other than the active regions, the field oxide film may be formed.

According to the present invention, since the etching process for isolating the floating gates is not performed, the side walls of the floating gates and the tunneling oxide film Just under both ends of the floating gates are not damaged at all by the irradiation performed during the RIE method. Thus the defect caused by the irradiation damage may be reduced. The data is erased by an FN tunneling. Therefore, if the defects become hole traps or if a positive charge is generated in the tunneling oxide film because of the damage given by the plasma irradiation, then the barrier height of the tunneling oxide film becomes low and much FN tunneling current flows. As a result, transistors having an excessively high erasure rate are disadvantageously obtained.

The method of the present invention may reduce the number of such transistors having an extremely high erasure rate by eliminating the defect and the charge and may concentrate the distribution of the threshold voltage after the erasure as compared with a conventional method. As a result, the rewrite ability and the data storage property may be improved.

In addition, according to the present invention, since it is no longer necessary to remove the ONO film on the side walls of the floating gates when the ONO film is etched in order to from the control gate, the residue of the field oxide film, which has been adversely generated conventionally, may be reduced. Therefore, the overlap margin between the floating gate and the field oxide film may be set to be zero.

Various other modifications will be apparent to and can be readily made by those skilled in the art without departing from the scope and spirit of this invention. Accordingly, it is not intended that the scope of the claim appended hereto be limited to the description as set forth herein, but rather that the claims be broadly construed.

What is claimed is:

1. A method for producing a nonvolatile semiconductor memory device comprising the steps of:

forming a field insulating film on an isolation region on a semiconductor substrate and forming a tunneling oxide film on an active region;

depositing a silicon film on the semiconductor substrate;

forming stripe-shaped silicon portions including a plurality of first portions to be used as a plurality of floating gates and a plurality of second portions interposed between two adjacent portions of the plurality of first portions by patterning the silicon film;

forming an insulating film so as to cover at least the stripe-shaped silicon portions;

forming a conductive film so as to cover the insulating film;

forming a control gate so as to cover the plurality of first portions of the stripe-shaped silicon portions by patterning the conductive film;

converting the plurality of second portions of the stripe-shaped silicon portions into a silicon oxide film, and forming the plurality of floating gates from the plurality of first portions by thermally oxidizing the plurality of second portions; and implanting impurity ions through the silicon oxide film into the active region on the semiconductor substrate by using the control gate as a mask, thereby forming a source region and a drain region in the active region.

2. A method for producing a nonvolatile semiconductor memory device according to claim 1, wherein the silicon film is in an amorphous state immediately after the silicon film is deposited, and then crystallized by performing a subsequent annealing process.

3. A method for producing a nonvolatile semiconductor memory device according to claim 1, wherein a thickness of the silicon film ie set to be in a range of 10 to 20 nm immediately after the silicon film is deposited.

4. A method for producing a nonvolatile semiconductor memory device according to claim 1, wherein the conductive film has a polycide structure.

5. A method for producing a nonvolatile semiconductor memory device according to claim 1, wherein the stripe-shaped silicon portions are formed so as to completely cover the active region.

6. A method for producing a nonvolatile semiconductor memory device according to claim i, wherein the insulating film is an ONO film constituted by a first oxide film, a nitride film and a second oxide film.

7. A method for producing a nonvolatile semiconductor memory device according to claim 6, wherein the step of forming the control gate comprises a step of continuously etching the conductive film and the insulating film, thereby removing at least a portion of the insulating film located over upper surfaces of the plurality of second portions of the stripe-shaped silicon portions.

8. A method for producing a nonvolatile semiconductor memory device comprising the steps of:

forming a field insulating film on an isolation region on a semiconductor substrate and forming a tunneling oxide film on active regions, each of the active regions extending in a first direction;

depositing a silicon film on the semiconductor substrate;

forming stripe-shaped silicon portions including a plurality of first portions to be used as a plurality of floating gates and a plurality of second portions interposed between two adjacent portions of the plurality of first portions by patterning the silicon film, the stripe-shaped silicon portions covering the active regions;

forming an insulating film so as to cover at least the stripe-shaped silicon portions;

forming a conductive film so as to cover the insulating film;

forming a plurality of control gates so as to cover the plurality of first portions of the stripe-shaped silicon portions by patterning the conductive film, the control gates extending in a second direction which is perpendicular with the first direction;

converting the plurality of second portions of the stripe-shaped silicon portions into silicon oxides, and forming the plurality of floating gates from the plurality of first portions by thermally oxidizing the plurality of second portions; and implanting impurity ions through the silicon oxides into the active regions on the semiconductor substrate by using each of the control gates as a mask, thereby forming a source region and a drain region in each of the active regions.

9. A method for producing a nonvolatile semiconductor memory device according to claim 1, wherein the step of depositing a silicon film includes depositing an amorphous silicon film with a thickness of about 10 to 20 nm and heat treating the deposited amorphous silicon film to produce a crystallized silicon film.

* * * * *